United States Patent [19]

Arnold et al.

[11] Patent Number: 4,823,869

[45] Date of Patent: Apr. 25, 1989

[54] HEAT SINK

[75] Inventors: Allen J. Arnold, Lagrangeville; Kerry L. Sutton, Wappingers Falls, both of N.Y.

[73] Assignee: International Business Machines Corporation, Armonk, N.Y.

[21] Appl. No.: 166,740

[22] Filed: Mar. 2, 1988

Related U.S. Application Data

[63] Continuation of Ser. No. 876,054, Jun. 19, 1986, abandoned.

[51] Int. Cl.⁴ .............................................. F28F 7/00
[52] U.S. Cl. .................................. 165/185; 174/16.3
[58] Field of Search ...................... 165/185, 80.3, 80.4; 361/382, 383, 384; 174/16; 357/81

[56] References Cited

U.S. PATENT DOCUMENTS

| | | | |
|---|---|---|---|
| 3,213,336 | 10/1965 | McAdam | 317/234 |
| 3,219,885 | 11/1965 | Schniers | 361/388 |
| 3,258,386 | 6/1966 | Blythe | 165/185 |
| 3,943,323 | 3/1976 | Smith et al. | 165/185 X |
| 4,103,737 | 8/1978 | Perkins | 165/80 |
| 4,246,455 | 10/1981 | Leaycraft et al. | 361/383 |
| 4,369,838 | 1/1983 | Asanuma et al. | 165/185 |
| 4,508,161 | 4/1985 | Holden | 165/185 X |
| 4,541,004 | 9/1985 | Moore | 357/81 |
| 4,601,202 | 7/1986 | Colman et al. | 361/382 X |
| 4,715,438 | 12/1987 | Gobuzda et al. | 165/185 |

FOREIGN PATENT DOCUMENTS

| | | | |
|---|---|---|---|
| 662743 | 4/1965 | Fed. Rep. of Germany ... | 174/16 HS |
| 420255 | 4/1947 | Italy | 165/185 |
| 2163287 | 2/1986 | United Kingdom | 357/81 |

OTHER PUBLICATIONS

IBM Technical Disclosure Bulletin, "Thermal Enhancement of Moduler", vol. 19, No. 8, Jan. 1977.
J. L. Horvath, *IBM Technical Disclosure Bulletin,* vol. 23, No. 2, 7/80, pp. 603–604.
A. J. Arnold et al., *IBM Technical Disclosure Bulletin,* vol. 22, No. 6, 11/79, pp. 2297–2298.

*Primary Examiner*—Ira S. Lazarus
*Assistant Examiner*—Peggy Neils
*Attorney, Agent, or Firm*—Jesse L. Abzug; Joseph C. Redmond, Jr.

[57] ABSTRACT

An improved heat sink is disclosed in which a plurality of heat conducting fins extends form a base of heat conductive material. The top surface of the base is peaked to reduce the dead space that would otherwise occur during vertical impingement air flow. In the preferred embodiment, the top surface is pyramidal in shape with the peak at the center. In other embodiments, the top surface can be convex or concave and have the peak located off center. Also, webs of material can be left at the bottom of the cooling fins to provide channels for improved air flow.

4 Claims, 4 Drawing Sheets

HEAT SINK

This is a continuation application of Ser. No. 876,054, filed June 19, 1986, now abandoned.

BACKGROUND OF THE INVENTION

1. Field of Invention

This invention relates to an improved heat sink for cooling modules containing semiconductor chips. More particularly, a heat sink having a peak near its center for enhancing cooling efficiency is disclosed.

2. Background Information

As the density of very large scale integrated (VLSI) circuits continues to increase, the amount of heat generated also increases and becomes more of a problem. In air cooled semiconductor modules, cooling is facilitated by the use of fins of heat conducting material to increase the surface area for radiating heat to the air. Examples of such structures can be found in the *IBM Technical Disclosure Bulletin*, "Cooling Fin Structure" by J. L. Horvath, Vol. 23, No. 2, July 1980, page 603.

This structure consists of a network of vertical, serpentine fins mounted on a base element, typically a cover for a semiconductor package. Since the base element is flat, this cooling structure is effective in both transverse and impingement air flow. However, this design is inefficient during impingement air flow since the air parts as it hits the surface, thereby creating a dead space near the top surface of the heat sink (FIG. 1). The presence of this dead space limits the cooling efficiency of the heat sink.

While in the past, this limitation has not been a problem, this is no longer the case. Circuit densities have increased so greatly that any limitation in heat transfer can no longer be tolerated. Accordingly, it is desirable to have a heat sink suitable for cooling a semiconductor module with a vertical impingement air flow that maximizes the cooling efficiency by eliminating the dead space.

OBJECTS OF THE INVENTION

It is an object of this invention to provide an improved heat sink that reduces the dead space.

It is another object to provide a heat sink having a peaked roof to facilitate air flow.

It is a further object to provide a heat sink with webbed fins to channel the air flow through the heat sink.

SUMMARY OF THE INVENTION

In accordance with these, and other objects that may be apparent, an improved heat sink for a semiconductor module is provided. The heat sink includes a base of heat conductive material which is peaked on the top surface to reduce the dead space that would otherwise occur during vertical impingement air flow. Extending from the top surface of the base are a plurality of vertical cooling fins, also made from a highly heat conductive material. In the preferred embodiment, the top surface is pyramidal in shape, with four triangular surfaces meeting in a peak at the center. In other embodiments, the top surface can have other shapes, such as convex or concave curves. Further, the peak does not have to be located at the center, but should be located at the optimal position for enhanced air flow, which is determined by the air flow dynamics of the environment. Also, in another embodiment, webs of material can be left at the bottom of the cooling fins to provide channels for improved air flow.

BRIEF DESCRIPTION OF THE DRAWINGS

The foregoing and other advantages of the invention will be more fully understood with reference to the description of the best mode and the drawing wherein.

DESCRIPTION OF THE BEST MODE FOR CARRYING OUT THE INVENTION

Figure 1:
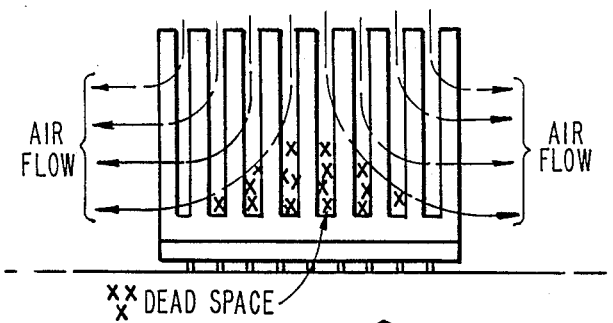
FIG. 1 is a side view of a heat sink as known in the prior art.
Figure 2:
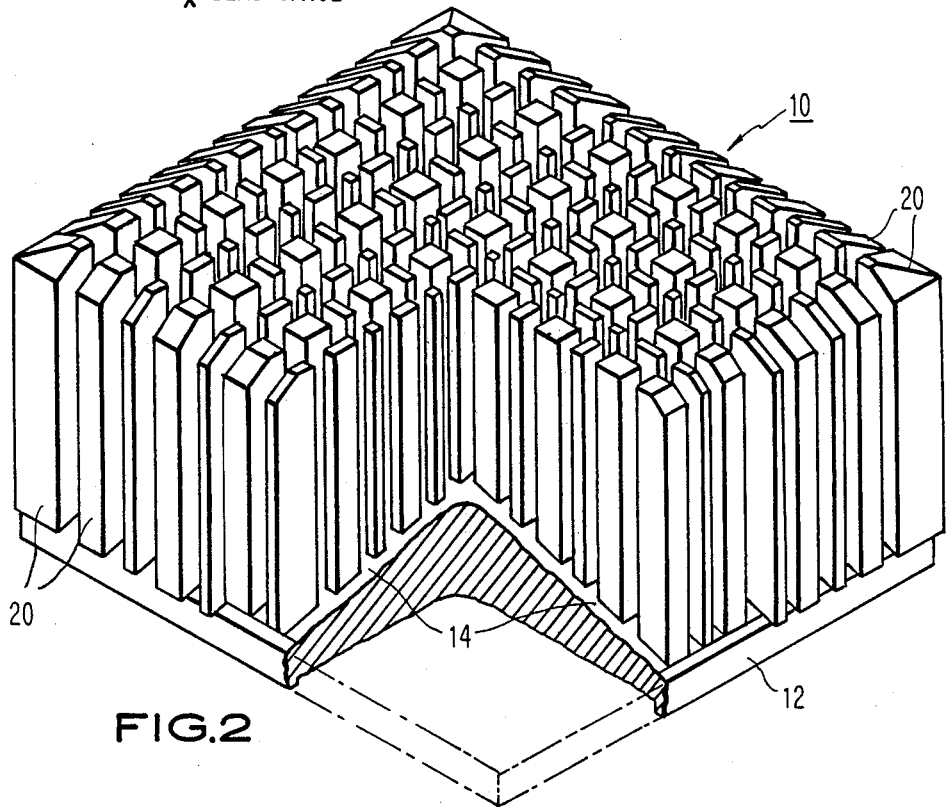
FIG. 2 is a perspective view of the heat sink in accordance with this invention.
Figure 3:
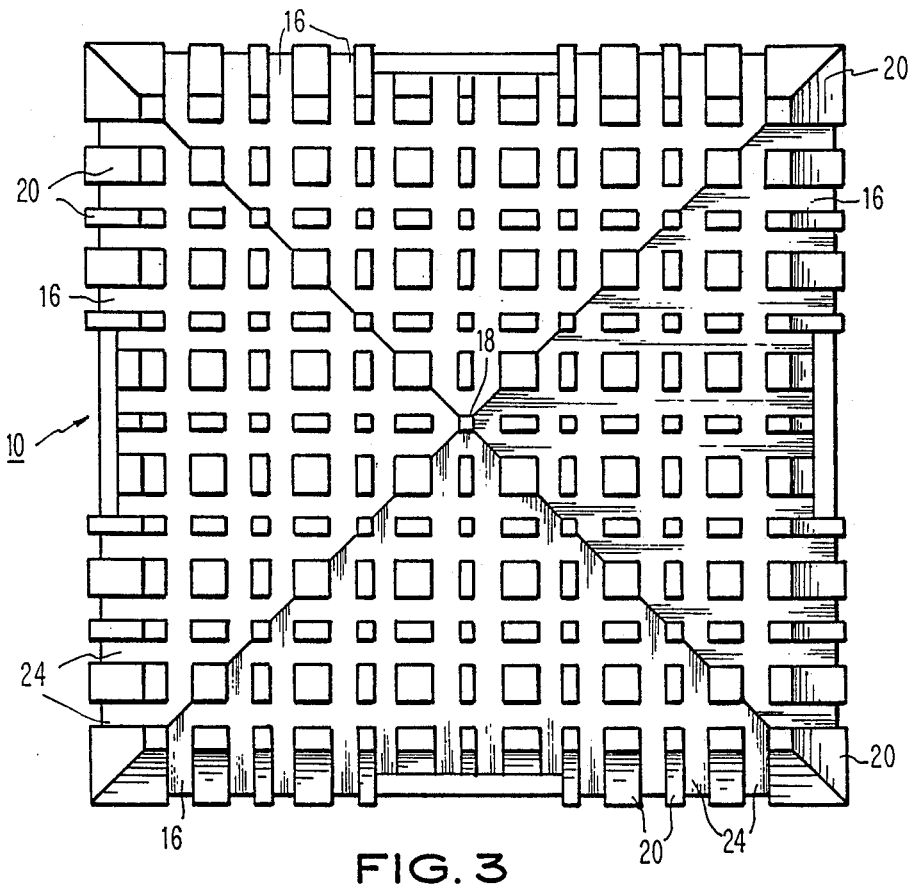
FIG. 3 is a top view of the heat sink in accordance with this invention.

Referring to FIGS. 2 and 3, heat sink 10 has a base 12 fabricated from a heat conducting material such as aluminum, copper, alloys of each, etc. In the preferred embodiment, top surface 14 is pyramidal in shape, having four triangular planar surfaces 16 which meet at peak 18. Extending vertically from the top surface 14 are a plurality of cooling fins 20. Cooling fins 20 increase the surface area for the conduction of heat from a semiconductor module (not shown) to the ambient air. The shape, size and spacing of the cooling fins 20 are not critical to this invention and can be selected to optimize the heat transfer in a specific environment. Peak 18 is shown at the center of heat sink 10, but can be designed off-center, if desired, to maximize the air flow through the heat sink.

Figure 4:
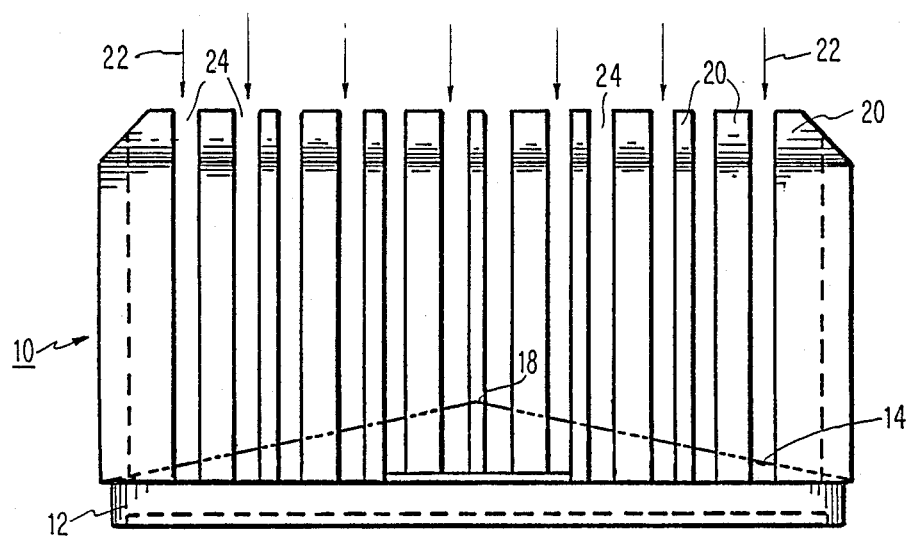
FIG. 4 is a side view of the heat sink in accordance with this invention.

Impingement air flow, directed from above, is shown by arrows 22 in FIG. 4. As the cooling air flows through channels 24 between cooling fins 20, it will deflect, or part, and flow towards the periphery of the heat sink. As the air travels toward the periphery in contact with the surface 14, more heat will be absorbed, further increasing the cooling efficiency. As stated in the Background section, the peak 18 and pyramidal shaped top surface 14, eliminate the "dead space" near the center of the heat sink which would occur if the top surface were flat. Studies have demonstrated a 12 percent gain in cooling efficiency by the elimination of the "dead space."

Figure 5:
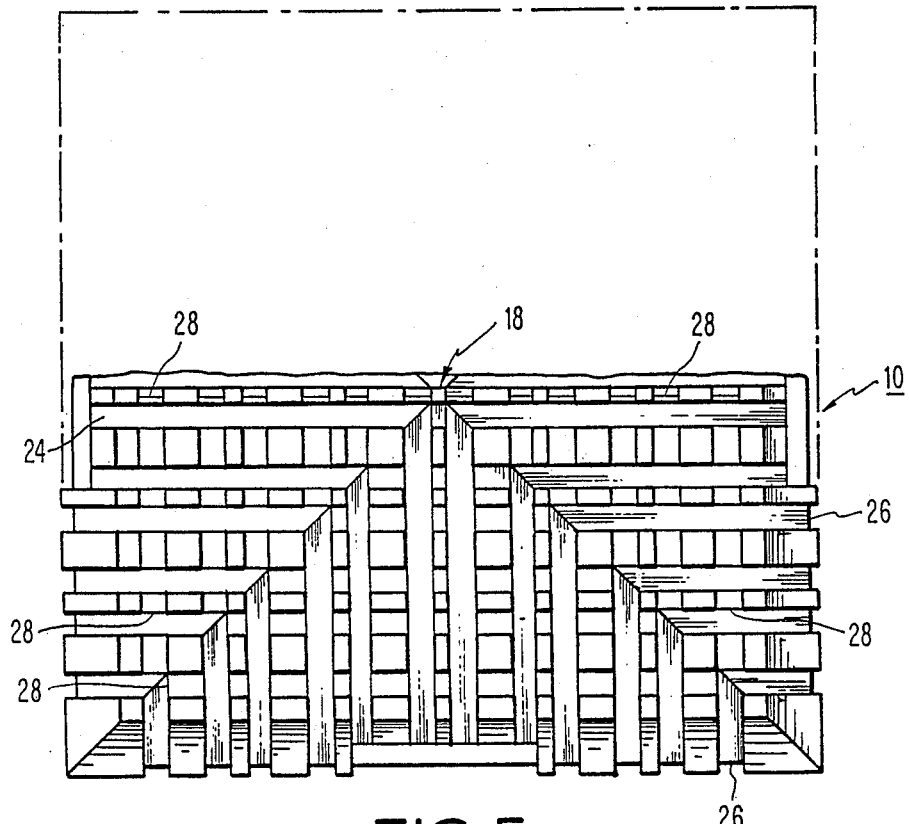
FIG. 5 is a top view of the heat sink with residual webs of material.
Figure 6:
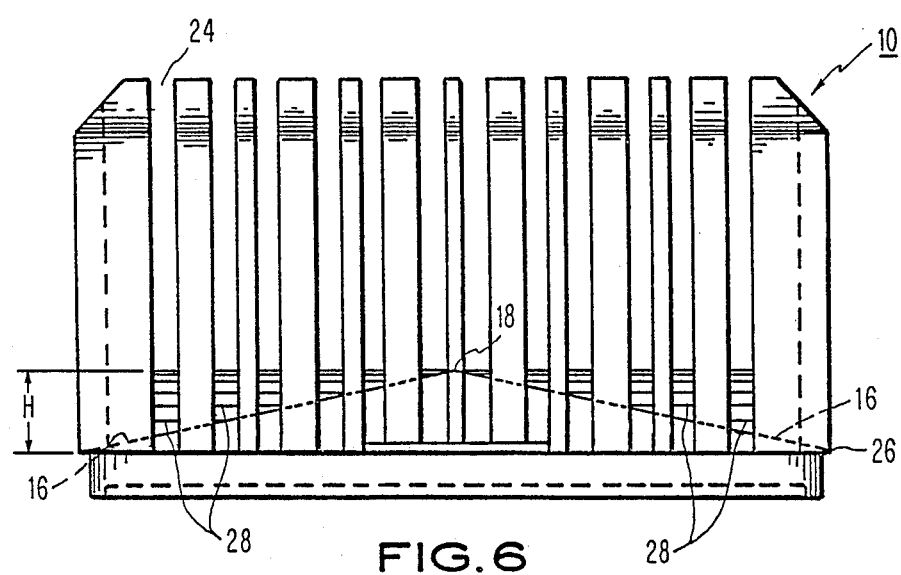
FIG. 6 is a side view of the heat sink with residual webs of material.
Figure 8:
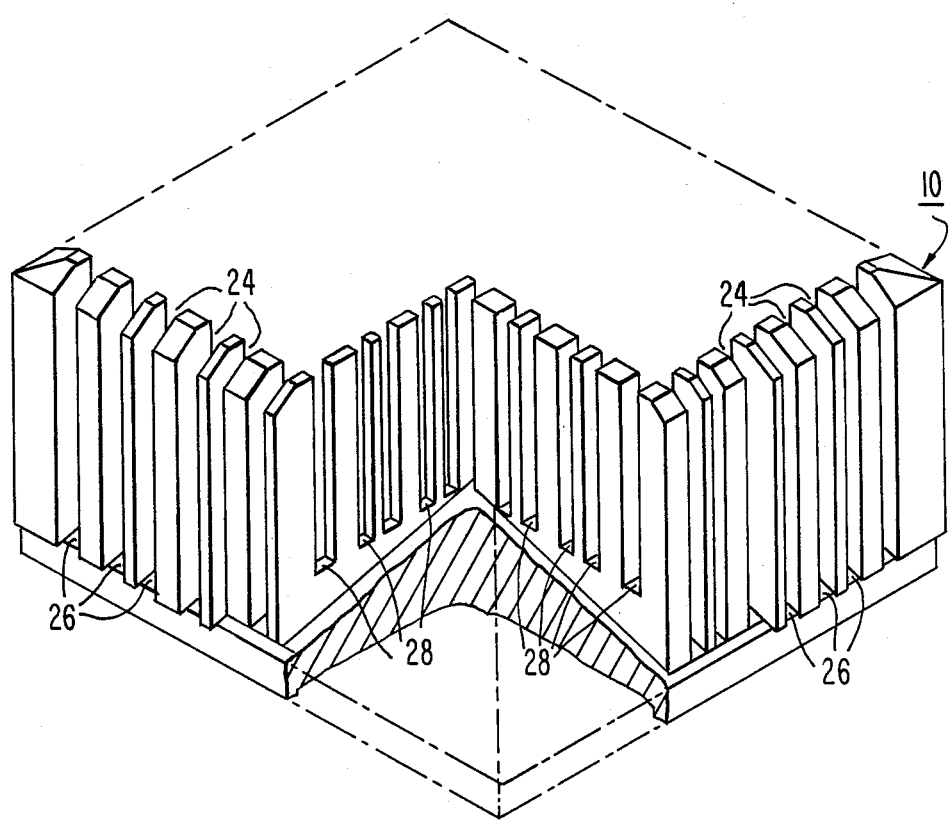
FIG. 8 is a perspective view partly in section of a heat sink with residual webs of material.

The fabrication of the heat sink in accordance with this invention can be done using manufacturing processes well-known in the art such as milling, casting, etc. When using milling, or cutting processes, an additional, unexpected improvement in cooling efficiency can be realized. For example, a solid block of aluminum is first cut to size (FIGS. 5 and 6). Then, each of the four triangular planar surfaces 16 is cut individually from the bottom edges 26 of the heat sink 10 sloping upwards toward where the peak 18 is desired. When all four planar surfaces 16 have been cut, webbed fins 28 will remain within some of the channels 24. The height of the webbed fins 28 will vary from height H at the periphery to zero at the peak due to the slanted surfaces

16. These webbed fins 28 direct the air flow through the heat sink 10, further increasing its cooling efficiency.

Figure 7:
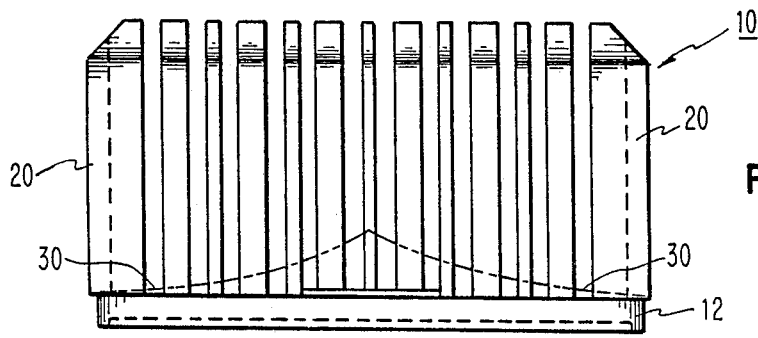
FIG. 7 is a side view of an alternative embodiment of the heat sink in accordance with this invention.

While the invention has been described with reference to a preferred embodiment, it will be understood by those skilled in the art that various changes can be made in the design without departing from the spirit and scope of the invention. For example, the height and location of the peak can be optimized for particular applications. Also, the heat sink can serve as the cover for the semiconductor module, or it can be soldered to a ceramic module cap. Finally, the top surface 30 can have concave surfaces, as seen in FIG. 7. Therefore, the invention should only be limited as specified in the claims.

What is claimed is:

1. A heat sink for cooling modules containing semicondcutor chips comprising:
 a base member of heat conducting material having a top surface and a bottom surface, said bottom surface in thermal contact with at least one semiconductor chip, said top surface having a pyramidal top surface having a peak at the intersection of four triangular surfaces; and
 a rectilinear array of cooling fins extending from said top surface, said rectilinear array providing a plurality of air flow channels between said cooling fins and in contact with all of the triangular planar surfaces;
 whereby an impinging flow of cooling air is directed by the peak of the top surface through the air flow channels and along the top surface, thereby improving the cooling efficiency of the heat sink.

2. The heat sink as claimed in claim 1 further comprising a plurality of residual webs of material between said cooling fins to direct the air flow over said top surface.

3. The heat sink as claimed in claim 1 wherein said base member and said cooling fins are comprised of aluminum.

4. The heat sink as claimed in claim 2 wherein said base member and said cooling fins are comprised of aluminum.

* * * * *